United States Patent
Egitto et al.

(10) Patent No.: US 6,924,224 B2
(45) Date of Patent: Aug. 2, 2005

(54) METHOD OF FORMING FILLED BLIND VIAS

(75) Inventors: Frank D. Egitto, Binghamton, NY (US); Elizabeth Foster, Friendsville, PA (US); Raymond T. Galasco, Vestal, NY (US); Voya R. Markovich, Endwell, NY (US); Manh-Quan Tam Nguyen, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/729,174

(22) Filed: Dec. 5, 2003

(65) Prior Publication Data

US 2004/0132279 A1 Jul. 8, 2004

Related U.S. Application Data

(62) Division of application No. 10/263,909, filed on Oct. 3, 2002.

(51) Int. Cl.[7] .................... H01L 21/4762; H01L 21/44
(52) U.S. Cl. .................... 438/622; 438/675; 438/678
(58) Field of Search .................... 438/618–626, 438/652, 666–675, 677, 678, 686–688, 633, 637, 638–647, 662, 687; 257/758, 760, 762, E21.578, E23.145

(56) References Cited

U.S. PATENT DOCUMENTS

| 5,141,897 | A | | 8/1992 | Manocha et al. ............ 437/228 |
| 5,227,013 | A | | 7/1993 | Kumar ....................... 156/644 |
| 5,841,075 | A | * | 11/1998 | Hanson ....................... 174/250 |
| 6,000,129 | A | | 12/1999 | Bhatt et al. ................... 29/852 |
| 6,020,255 | A | | 2/2000 | Tsai et al. .................... 438/618 |
| 6,083,824 | A | | 7/2000 | Tsai et al. .................... 438/629 |
| 6,195,883 | B1 | | 3/2001 | Bhatt et al. ................... 29/852 |
| 6,210,555 | B1 | | 4/2001 | Taylor et al. ............... 205/103 |
| 6,287,968 | B1 | * | 9/2001 | Yu et al. ..................... 438/675 |
| 6,303,014 | B1 | | 10/2001 | Taylor et al. ............... 205/103 |
| 6,323,118 | B1 | | 11/2001 | Shih et al. ................... 438/624 |
| 6,649,517 | B2 | * | 11/2003 | Teh et al. .................... 438/640 |
| 2001/0002510 | A1 | | 6/2001 | Hsu ............................ 29/852 |
| 2002/0056645 | A1 | | 5/2002 | Taylor et al. ............... 205/103 |
| 2002/0083586 | A1 | | 7/2002 | Iijima et al. .................. 29/847 |
| 2002/0192944 | A1 | * | 12/2002 | Sonderman et al. ........ 438/637 |

FOREIGN PATENT DOCUMENTS

WO   WO 01/45149 A1   6/2001   ......... H01L/21/285

* cited by examiner

*Primary Examiner*—George Fourson
*Assistant Examiner*—Brook Kebede
(74) *Attorney, Agent, or Firm*—James A. Lucas; Driggs, Lucas, Brubaker & Hogg Co., LPA

(57) ABSTRACT

The density of electronic packaging and the electrical reliability of the sub-assemblies utilizing stacked blind vias are improved by providing a blind, landless via in a first dielectric layer laminated to a conductive metal core serving as a ground plane or a power plane. A hole is provided through the dielectric layer extending to the core. A metal, such as copper, is deposited electrolytically using the metal core as the cathode, or electrolessly without seeding into the hole. The metal is deposited on the core and progressively builds in the hole to the depth required for the via. A second dielectric layer is laminated to the first, and is provided with a second layer blind via aligned with the first via. This second via may be formed by conventional plating techniques. Multiple dielectric layers with stacked blind vias can be assembled in this manner.

22 Claims, 3 Drawing Sheets

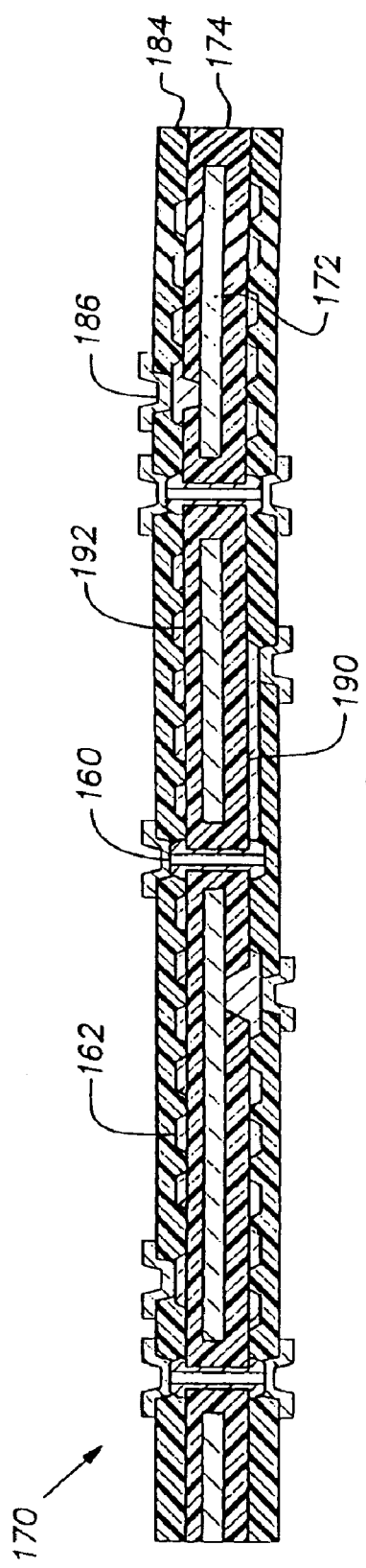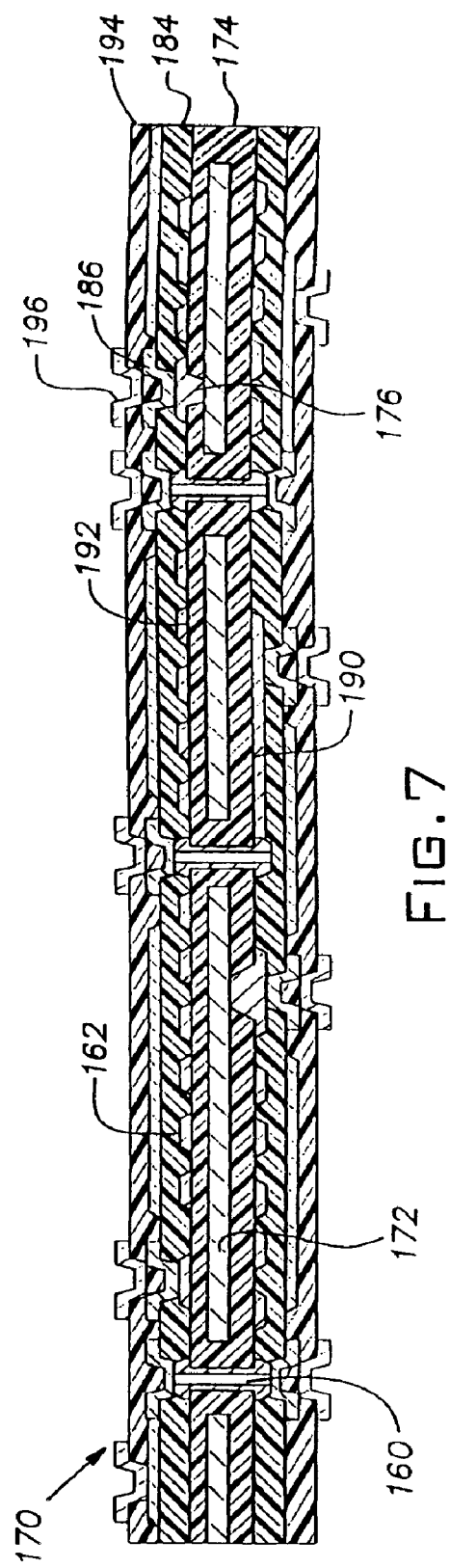

METHOD OF FORMING FILLED BLIND VIAS

CROSS REFERENCE TO RELATED APPLICATIONS

This application is a divisional of application Ser. No. 10/263,909, filed Oct. 3, 2002, Now Publication No. U.S. 2004/0065960 A1.

BACKGROUND OF THE INVENTION

1. Field of the Invention

This invention relates generally to the field of electronic packaging of printed wiring boards. More particularly, it relates to the fabrication of electronic systems for panel and chip carrier configurations.

2. Discussion of Related Art

The constantly increasing speed of chips is driving increased circuit density on the associated electronic packages for both panel and chip carrier applications. One method to increase packaging density and limit the number of package layers in the Z direction is utilization of stacked vias. Conventional stacked vias contain surface metal lands and the vias are not completely filled. Accordingly, their use in contact with a ground or power plane is somewhat limited. Other drawbacks are that they often utilize more than one metal, such as copper applied by electroless plating, sputter coating or vapor deposition followed by electrolytic copper. The plating of the electroless layer typically requires a seed layer to initiate plating, thereby introducing an additional material. This, as well as the differences in the physical characteristics between the different deposited layers, creates an interface between the layers, thereby adversely affecting the conductivity through the interface. Furthermore, the process for forming the vias involves the plating of metal into the vias at the same time as the metal is deposited on the planar surface. This then requires the subsequent removal of the plated metal from the surface.

There is no stacked via structure containing filled landless vias for power or ground connections being used at the present time in electronic packages. There are examples of stacked filled vias having lands. These examples utilize methods that result in plating of the via side wall and bottom surface simultaneously and can result in voided volumes within the plated via. In addition, with traditional seed and plate processes, one cannot be assured that the metal contact at the base of the via is electrically continuous and reliable due to the presence of an additional material interface.

BRIEF DESCRIPTION OF THE INVENTION

One object of the present invention is to produce a stacked via structure and method of fabrication containing stacked vias with filled blind vias connecting power or ground planes.

Another object is to improve the reliability of blind vias in stacked arrays.

These and other objects and advantages will become self evident based on the following disclosure. More specifically, the invention relates to a stacked sub-assembly and the method of making the same. The sub-assembly comprises a core of conductive metal, a first dielectric layer laminated to said core, and at least a first blind via extending through the first dielectric layer to a surface of the conductive metal. The first blind via is filled with metal deposited from an electroplating bath or from an electroless bath that is not preceded by seeding. The first blind via is landless. In one embodiment, a second dielectric layer is laminated to the first dielectric layer and includes a second layer blind via aligned with the first blind via and having a base in contact the first blind via. The first blind via preferably is larger in cross section than said base of the second layer blind via. However, it can be the same size or smaller as deemed appropriate. In another embodiment, the first blind via includes a contact pad. The second dielectric layer is laminated to the first dielectric layer and a second layer blind via is aligned with the first blind via. The second layer via includes a base in contact with the contact pad. The first blind via can be smaller, the same size or larger in cross section than the base of the second layer via, and the contact pad is at least as large as the base of the second layer via.

The conductive metal core preferably serves as a ground plane or a power plane. The metal deposited in the blind via typically is copper electrodeposited from an acid copper plating bath. The electrodeposit has a nearly equiaxial fine grained structure, an elongation between about 10% and about 20%, and an ultimate tensile strength of about 30,000 and about 50,000 psi. As before, the description of the stacked assembly is repeated on the reverse side of the conductive metal layer, even though it is not shown in FIGS. 1B and 1C. Furthermore, there can be third layer and fourth layer blind vias stacked on the first and second vias. Instead of electroplating, the copper can be deposited on the core without plating on the wall of the via from an electroless bath without seeding. The omission of the seeding step eliminates the undesirable plating on the wall of the via.

The invention also relates to a method of forming a blind via through a dielectric layer that is laminated to a core of conductive metal. The via terminates at a first surface of the metal core. The method comprises a first step of preparing a contaminant free hole in the dielectric layer terminating at the surface of the metal core. If the metal is to be electroplated, this is followed by the steps of a) making the metal core a cathode in an electroplating bath, and b) electroplating a conductive metal into the hole to cover at least the bottom of the hole to form a first blind via. The conductive metal electroplate preferably is copper deposited from an acid copper bath. Instead of electroplating, the copper can be deposited on the core without plating on the wall of the via from an electroless bath without seeding. The omission of the seeding step eliminates the undesirable plating on the wall of the via.

The core typically forms a ground or power plane of an electronic sub-assembly. The hole in the laminate may be prepared by laser drilling followed by removal of drill debris, if any. After the deposition, any excess copper extending above the dielectric surface is removed to create a filled blind via without a land. A second dielectric layer is laminated to the first dielectric layer, after which a second layer blind via is developed in the second layer. This second layer blind via is aligned with the first blind via and has a base in contact with said first layer via. The first blind via can be larger in cross section than the base of the second layer via to facilitate registration during alignment. However, it can be the same or smaller as well, particularly where higher circuit densities are an objective. A contact pad can be plated on top of the first blind via on the surface of the first dielectric layer, and a second dielectric layer is laminated to the first dielectric layer. The second layer blind via is developed in the second dielectric and is aligned with the first layer via. The base or bottom of the second layer via abuts the contact pad. The cross section of the first blind via can be made smaller than the base of the through via, whereas the contact pad is larger than said base to facilitate registration. As previously noted, the method is carried out to produce stacked blind vias on both sides of the conductive metal layer. The method can be repeated to form additional blind vias stacked on top of the first and second blind vias.

BRIEF DESCRIPTION OF THE DRAWINGS

FIGS. 2 through 7 show the progressive steps of the method of the present invention.

DETAILED DESCRIPTION OF THE INVENTION

Figure 1A:
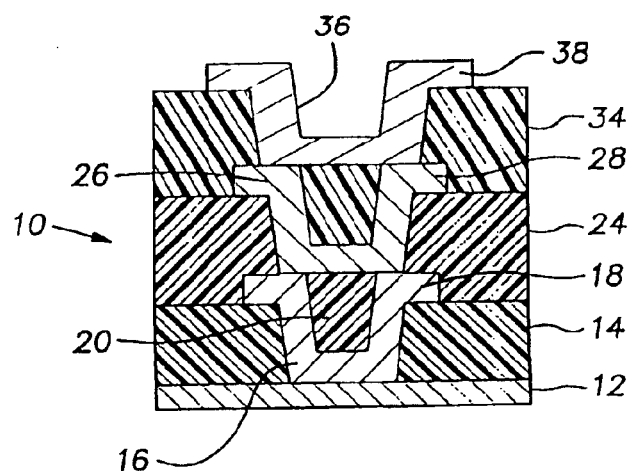
FIG. 1A is an elevational cross section of a prior art electronic package.

A small segment of a typical prior art structure is shown in elevation in FIG. 1A. The structure 10 comprises a core 12 of conductive metal that typically serves as a ground plane or a power plane. Laminated to the core 12 is a first layer 14 made from a suitable dielectric material, such as an epoxy glass commonly known as FR-4, and sold under the Dryclad® mark. A hole is drilled through the dielectric layer 14 down to the core. The hole is cleaned to remove debris after which a layer of conductive metal, such as copper, is then plated in the hole to form a blind via 16. This conductive via 16 typically is plated by seeding the hole with a suitable catalyst, such as palladium/tin, followed by flash plating a thin layer of copper from an electroless plating bath, or by sputter coating or vacuum vapor deposition. Because of the difficulty of confining the seeding to the hole itself, the planar surface at the top of the dielectric around the hole is likewise seeded. Consequently, when the copper is electroplated, a pad 18 of surface metal (also called a land) is formed on the planar surface of the dielectric around the hole. Furthermore, the hole is plated on the side as well as the bottom of the hole, leaving a cup-shaped void 20 in the via.

The next step in the fabrication process involves laminating a second dielectric layer 24 on top of the first layer 14. The lamination is typically done with pressure at an elevated temperature, causing some of the dielectric to fill the void 20 in the bottom via. Then the process of drilling, cleaning, seeding and plating is repeated to form a second blind via 26 in electrical contact with the first via. Again, the two-step plating procedure causes the formation of a land 28 around the second layer blind via 26.

The procedure of lamination, drilling, cleaning, seeding and plating is then repeated to form a third dielectric layer 34, a third layer blind via 36, and an associated land 38. It has previously been observed that the same procedure is replicated on the reverse surface of the core 12 whereupon the core is embedded in dielectric layers with blind vias extending to the core from both sides as depicted in FIGS. 2–7.

It should be noted that various types of electronic circuitry, as well as active and passive devices (conductors, resistors, capacitors, etc.), typically are incorporated into the sub-assembly between the adjacent dielectric layers in accordance with established practices.

As previously stated, this conventional method of making stacked blind vias suffers from shortcomings. Among them is the presence of the surface metal lands. Another is that the blind vias are not completely filled with conductive metal. Furthermore, there is no reliable means of insuring good electrical contact between the base of the first blind via and the power or ground plane. Good contact can be rendered difficult due to the introduction of contaminants and other materials into the hole during lamination, drilling, seeding and electroless plating, and the failure to remove them before electrodeposition.

Figures 1B, 1C:
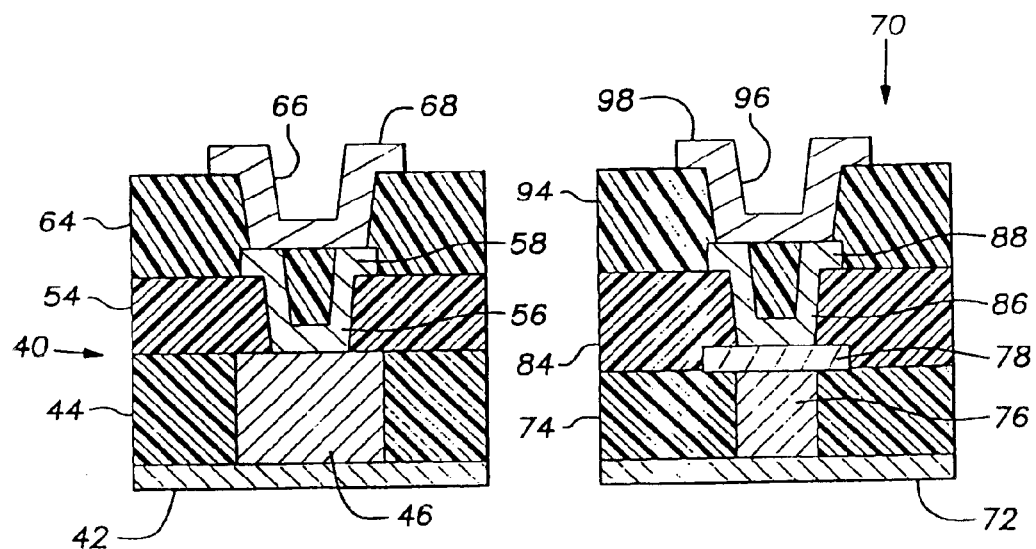
FIGS. 1B and 1C show two embodiments in cross section of the structure of the present invention.

FIG. 1B shows one embodiment of the present invention wherein the filled plated via is larger in cross section than the base of the partially filled plated via in the next layer. The structure 40 comprises a core 42 of conductive metal that serves, for example, as a ground plane or a power plane. Laminated to the core 42 is a first layer 44 made from a suitable dielectric material. As with the conventional vias, a hole is drilled through the dielectric layer 44 down to the core. After the hole is cleaned to remove debris, a layer of conductive metal, such as copper, is then electroplated in the hole to form a first solid or filled via 46. The metal preferably is electrolytically plated from an acid bath with the core serving as the cathode. Instead of electroplating, the metal can be deposited on the core without plating on the wall of the via from an electroless bath without seeding. The omission of the seeding step eliminates the undesirable plating on the wall of the via. This results in the metal being deposited solely on the surface of the core and then progressively upward from the core, filling the hole from the core toward the surface of the dielectric layer. Significantly, the metal does not deposit out on the wall of the via as it is filled.

The next step in the fabrication process involves laminating a second dielectric layer 54 on top of the first layer 44. Because the first layer via 46 is void free, the lamination does not cause any of the second dielectric material to enter the first blind via. Then the process of drilling, cleaning, and plating is repeated to form a second conductive via 56 in electrical contact with the first via. The plating procedure is typically carried out in two steps, first using a layer of metal deposited electrolessly, or by sputter deposition or vapor deposition, followed by an electrodeposited layer. Again, as with the prior art shown in FIG. 1A, the two-step plating procedure causes the formation of a land 58 on the surface of the second dielectric layer 54. The first filled blind via 46 has a cross section that typically is larger than the cross section of the bottom portion or base of the second layer via 56. However, the present invention contemplates that the cross section of the first blind via 46 can be the same size or smaller than that of the base of the second layer via 58. The procedure of lamination, drilling, cleaning, seeding and plating can then be repeated to form a third dielectric layer 64, a third layer blind via 66, and an associated land 68. Additional layers can be added in a similar manner.

FIG. 1C is another embodiment wherein the filled blind via can be smaller in cross section than the base of the blind via in the second dielectric layer. The structure 70 comprises a core 72 of conductive metal that can serve as a ground plane or a power plane. Laminated to the core 72 is a first dielectric layer 74. As before, a hole is formed, by e.g. laser drilling, through the dielectric layer 74 to the core 72. The hole is cleaned to remove debris. A layer of conductive metal, such as copper from an acid copper bath, is electroplated in the hole using the core as the cathode to form a filled via 76. As before, an electroless copper bath without seeding can be used. A pad 78 caps the blind via 76, typically in a second plating step. The pad 78 is electroplated on top of the filled via to insure that the laser drilling step for the second layer via formation terminates at the filled hole surface. Typically, the pad is plated concurrently with the plating of conductive circuits and through holes on the remainder of the sub-assembly. The metal in the pad can be the same as the metal used to form the via, or it can be a different deposited metal. As before, a second dielectric layer 84 is laminated on top of the first layer 74. Then the conventional process of drilling, cleaning, seeding and plating is repeated to form a second layer blind via 86 in electrical contact with the first blind via 76. Again, the two-step plating procedure (electroless, vapor deposition, or sputtering followed by electrolytic plating) causes the formation of a land 88 on the second layer via 86. With the use of a contact pad 78 to provide the electrical continuity between the first blind via 76 and the second layer blind via 86, the cross section of the first blind via 76 can be substantially smaller than that of the second layer blind via stacked on top thereof. The procedure of lamination, drilling, cleaning, seeding and plating is then repeated to form a third dielectric layer 94, a third layer via 96, and an associated land 98. It is likewise understood that the entire procedure is replicated on the reverse side of the core 72. Additional stacked vias can be formed as needed to complete the sub-assembly An advantage of the filled blind vias is improved reliability versus that of partially filled vias. Also, for equivalent contact areas between the stacked vias, the cross section of the via stacked upon the filled via can be smaller than the cross section of a via stacked on an unfilled via. This allows for greater package density. The first blind via can be filled completely to the dielectric surface, or partially filled below the dielectric height, or overfilled above the dielectric height and then polished down to the dielectric surface as needed.

A typical method to fabricate the stacked structure of the present invention having landless blind vias is shown in FIGS. 2–7. A blind via is generally described as a conductive hole in a printed circuit or wiring board that terminates at a power or ground plane or at a conductive metal honeycomb layer.

Figure 2:
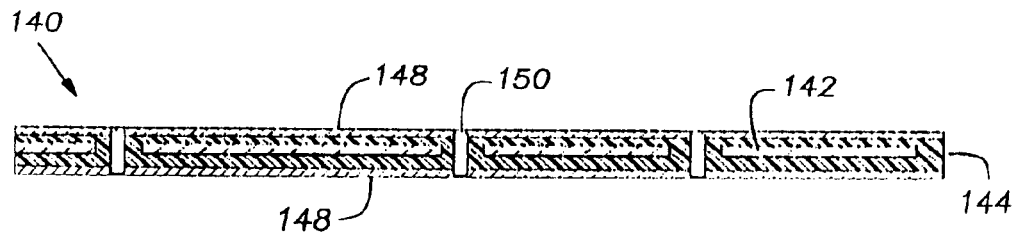

FIG. 2 shows a laminate 140 comprising a conductive metal core 142 embedded in a dielectric 144 clad in copper 148. The core comprises a CIC (copper Invar copper plane) or copper ground or power plane. Clearance holes 150 (if required) are etched in the core using standard methods. The copper-clad dielectric 144 is laminated on both sides of the core 142.

Figure 3:
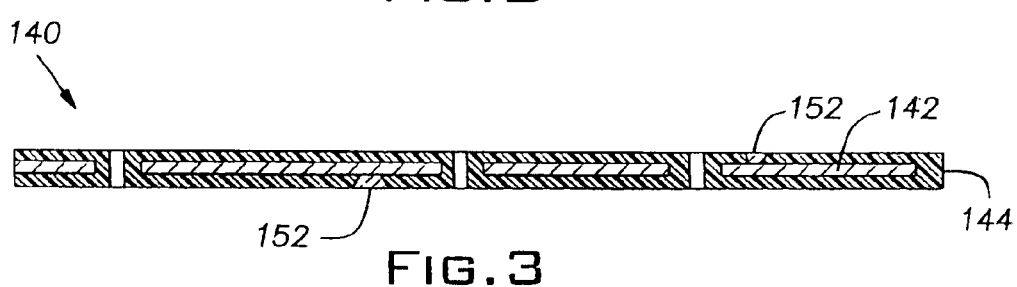

FIG. 3 shows the laminate with the surface copper cladding etched away and blind vias 152 (two being shown) laser drilled to the core 142 serving as the ground or power plane. One advantage of laser drilling over mechanical drilling is excellent Z direction depth control. Next, for electroplating, areas at the panel edge are laser skived (or mechanically removed) to the ground or power plane to act as electrical connections for plating. This is then optionally followed by the step of cleaning the blind vias 120 using, for example, plasma or permanganate to remove drill debris (if required).

Figure 4:
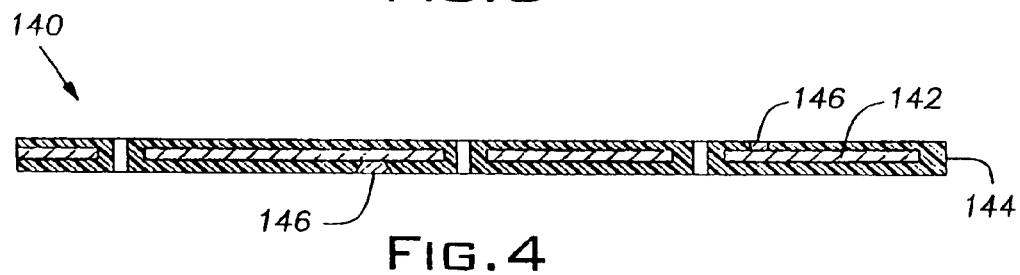

Electrical connections are made to the core 142 at the panel edge and the blind vias are filled, as shown in FIG. 4, with copper electroplate 146. For electroless plating, the electrical connections are not required. Plating occurs from the core at the bottom of the via without simultaneous plating on the via sidewalls. This insures that the via is completely filled, and electrical continuity is preserved. Next, the surface of the dielectric 114 is optionally subjected to a polish step, for example, by chemical and/or mechanical means to remove any plated copper above the dielectric surface to create a landless filled via.

Figure 5A:
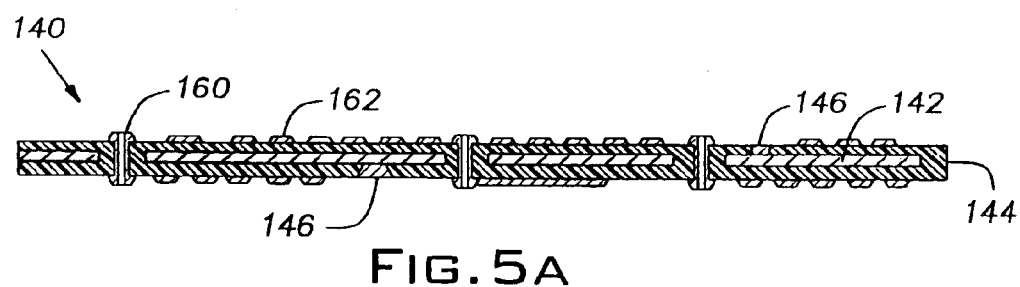
Figure 5B:
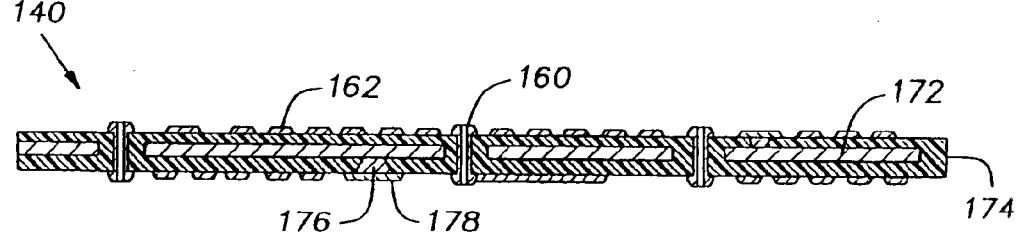

FIGS. 5A and 5B show the further steps of plating through via 160 and circuitizing the copper surfaces by conventional methods. FIG. 5A shows the formation of landless filled blind vias 146. These can be protected during the process steps with photoresist tents according to known techniques. If required, a surface pad can be plated on the exposed surface of the filled blind via facing away from the core 142. FIG. 5B shows a filled via 176 with such a pad 178.

FIGS. 6 and 7 show the build up of additional dielectric layers 184, 194 with stacked vias from the first dielectric layer 174 containing the filled blind vias 176. The additional dielectric layers 184, 194 are shown with a plurality of circuit traces or pads 162 and 192 shown in cross section and 190 shown in planar view. However, it is understood that details of these features are well understood and need not be explained in order to understand the teachings of the present invention.

The above method describes the fabrication of landless vias on one layer. Landless vias can be made for stacked via applications or other applications. The above method can be used multiple times in one package to create multiple landless via layers connected to ground or power planes by stacking. It can also be used for creating void-free blind filled vias in the second and third and subsequent dielectric layers as well.

The electroplating or electroless plating is not just limited to copper. Instead, other metals used in the integrated circuit chip manufacture, such as nickel, palladium, gold and alloys thereof, can be electroplated or deposited without seeding by electroless plating. After the electrodeposition step, palladium dendrites can be plated on top of the landless via surface to impart a rough or dendritic surface for improved connection to the subsequent layer. Another option is etching of the copper or other deposit to create a rough surface to improve connection to the subsequent layer. A surface finish of a hard metal (e.g. nickel or gold) can then be plated if required.

The process of this invention allows for use of filled blind vias and traditionally plated through holes in the same core structure. However, when plating blind vias using this method, the presence of a contaminant at the base of the blind via would prohibit plating in the via. Hence, the ability to form a plated stud (blind via) and/or the method of plating is intuitively indicative of a good electrical contact.

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. A method of forming a first blind via through a first dielectric layer having a first surface laminated to a conductive metal core, said first blind via terminating at a first surface of said conductive metal core, comprising the steps of;

a) preparing a contaminant-free hole in the dielectric layer terminating at the surface of the conductive metal core, and b) electrodepositing conductive copper metal from an acid copper bath into said hole using the conductive metal core as a cathode to build the copper deposit from the core surface, whereby the copper has a nearly equiaxial fine grained structure, an elongation between about 10% and about 20%, and an ultimate tensile strength of between about 30,000 psi and about 50,000 psi.

2. The method according to claim 1 wherein the contaminant-free hole is completely filled with the copper to form a filled blind via.

3. The method according to claim 1 further including laminating a second dielectric layer to a second surface of the first dielectric layer, providing a second layer blind via in the second dielectric layer aligned with the firs blind via, and having a base of the second layer via in contact with the first blind via.

4. The method according to claim 3 wherein the cross-sectional area of the first blind via is larger than the cross-sectional area of the base of the second layer blind via.

5. The method according to claim 3 further including the step of plating a contact pad on the second surface of the first dielectric layer in contact with the filled via.

6. The method according to claim 5 wherein the contact pad has a cross-section that is larger than the cross-section of the base of the second layer blind via.

7. The method according to claim 1 wherein excess metal extending above the dielectric surface is removed to form a landless filled blind via.

8. A method of forming first blind via through a first dielectric layer having a first surface laminated to a conductive metal core, said via terminating at a first surface of the conductive metal core, comprising the steps of:

a) preparing a contaminant-free hole in the dielectric layer terminating at the surface of the conductive metal core, b) plating a conductive metal into the contaminant-free hole to deposit the metal solely on the surface of the conductive metal core, and to build the metal deposit from the surface of the conductive metal core completely filling said hole with metal to form a filled landless blind via having an exposed surface, and c) imparting a rough surface to the top of the filled landless via.

9. The method according to claim 8 wherein the hole in the dielectric layer is prepared by laser drilling, followed by removal of residual drill debris.

10. The method according to claim 8 wherein the conductive metal is selected from the group consisting of copper, nickel, gold, palladium and their alloys.

11. The method according to claim 10 wherein the conductive metal is copper that is electroplated into the hole from an acid copper bath using the conductive metal core as a cathode.

12. The method according to claim 11 wherein the copper is electrodeposited in the contaminant-free hole to form a newly equiaxial fine grained structure.

13. The method according to claim 12 wherein the copper is deposited to form a structure having an elongation between about 10% and about 20% and an ultimate tensile strength of between about 30,000 psi and about 50,000 psi.

14. The method according to claim 8 wherein the metal is plated in the hole from an electroless plating bath without seeding.

15. The method according to claim 14 including the steps of laminating a second dielectric layer to the second surface of the first dielectric layer, and providing a second layer blind via aligned with the first blind via sand having a base in contact with the contact pad.

16. The method according to claim 15 wherein the cross-sectional area of the first blind via is larger than the cross-sectional area of the base of the second layer blind via.

17. The method according to claim 16 wherein the contact pad has a cross-section that is larger than the cross-section of the base of the second layer blind via.

18. The method according to claim 14 wherein the electroless plating bath is a copper bath.

19. The method according to claim 8 wherein the rough surface is imparted by plating palladium dendrites on the top of the filled landless via.

20. The method according to claim 8 wherein the rough surface is imparted by etching.

21. The method according to claim 8 further including the step of plating a contact pad on the second surface of the first dielectric layer in contact with the filled via.

22. The method according to claim 8 wherein excess metal extending shove the dielectric surface is removed to form a landless filled blind via.

* * * * *

UNITED STATES PATENT AND TRADEMARK OFFICE
CERTIFICATE OF CORRECTION

PATENT NO.   : 6,924,224 B2
DATED        : August 2, 2005
INVENTOR(S)  : Egitto et al.

It is certified that error appears in the above-identified patent and that said Letters Patent is hereby corrected as shown below:

Column 6,
Line 54, change ";" to -- : --.

Column 8,
Line 7, change "newly" to -- nearly --.
Line 17, change "sand" to -- and --.

Signed and Sealed this

Eleventh Day of October , 2005

JON W. DUDAS
*Director of the United States Patent and Trademark Office*